(12) United States Patent
Cui et al.

(10) Patent No.: US 11,929,282 B2
(45) Date of Patent: Mar. 12, 2024

(54) METHOD FOR PREPARING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Zhaopei Cui, Hefei (CN); Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 432 days.

(21) Appl. No.: 17/479,216

(22) Filed: Sep. 20, 2021

(65) Prior Publication Data
US 2022/0319915 A1    Oct. 6, 2022

Related U.S. Application Data

(63) Continuation of application No. PCT/CN2021/106247, filed on Jul. 14, 2021.

(30) Foreign Application Priority Data

Mar. 31, 2021   (CN) .......................... 202110350102.6

(51) Int. Cl.
*H01L 21/768*   (2006.01)
*H01L 23/528*   (2006.01)
*H10B 12/00*    (2023.01)

(52) U.S. Cl.
CPC .. *H01L 21/76832* (2013.01); *H01L 21/76816* (2013.01); *H01L 21/76885* (2013.01); *H01L 23/5283* (2013.01); *H10B 12/482* (2023.02)

(58) Field of Classification Search
CPC ................................... H01L 21/76832
See application file for complete search history.

(56) References Cited

U.S. PATENT DOCUMENTS

| 6,924,229 B2 | 8/2005 | Cheong |
| 11,139,302 B2 | 10/2021 | Sukekawa et al. |
| 2004/0126966 A1 | 7/2004 | Cheong |

(Continued)

FOREIGN PATENT DOCUMENTS

| CN | 103681677 B | 7/2018 |
| CN | 110970436 A | 4/2020 |

(Continued)

*Primary Examiner* — William A Harriston
(74) *Attorney, Agent, or Firm* — Cooper Legal Group, LLC

(57) ABSTRACT

The method for preparing the semiconductor structure includes: providing a substrate; successively arranging a first conductive material layer, a barrier material layer, a second conductive material layer and a first dielectric material layer on the substrate stacked onto one another; forming a supporting layer on the first dielectric material layer, in which the supporting layer includes a plurality of supporting pattern structures spaced apart from each other, and a first trench is provided between two adjacent supporting pattern structures; forming a second dielectric layer, in which the second dielectric layer fills the first trench; etching the second dielectric layer, the first dielectric material layer, the second conductive material layer, the barrier material layer and the first conductive material layer to form a bit line array; and forming a bit line protective layer.

15 Claims, 25 Drawing Sheets

(56) References Cited

U.S. PATENT DOCUMENTS

| | | | | |
|---|---|---|---|---|
| 2010/0164059 A1* | 7/2010 | Suzuki | ............... | H01L 23/5283 |
| | | | | 438/653 |
| 2015/0332959 A1* | 11/2015 | Singh | ............... | H01L 21/76802 |
| | | | | 438/627 |
| 2016/0155664 A1* | 6/2016 | Chan | ............... | H01L 21/31053 |
| | | | | 438/618 |
| 2020/0388619 A1 | 12/2020 | Sukekawa et al. | | |

FOREIGN PATENT DOCUMENTS

| | | |
|---|---|---|
| CN | 111653568 A | 9/2020 |
| CN | 112071839 A | 12/2020 |

\* cited by examiner

METHOD FOR PREPARING SEMICONDUCTOR STRUCTURE AND SEMICONDUCTOR STRUCTURE

CROSS-REFERENCE TO RELATED APPLICATIONS

This is a continuation application of International Patent Application No. PCT/CN2021/106247, filed on Jul. 14, 2021, which claims priority to Chinese Patent Application No. 202110350102.6, filed on Mar. 31, 2021 and entitled "METHOD FOR PREPARING SEMICONDUCTOR STRUCTURE AND SEMICONDUCTOR STRUCTURE". The disclosures of International Patent Application No. PCT/CN2021/106247 and Chinese Patent Application No. 202110350102.6 are incorporated by reference herein in their entireties.

TECHNICAL FIELD

The disclosure relates to the field of semiconductor manufacturing technologies, in particular to a method for preparing a semiconductor structure and a semiconductor structure.

BACKGROUND

With the rapid development of an integrated circuit manufacturing process, the requirement on integration of a semiconductor product is becoming higher and higher. With the improvement of the integration of the semiconductor product, the size of a semiconductor device is continuously reduced. For a semiconductor memory device, the distribution density of the bit lines in a memory cell array is continuously increased, the size thereof is continuously reduced and a spacing distance between two adjacent bit lines is continuously shortened, so that higher requirements are presented on the material, morphology, size, electrical parameters and other features of the bit lines in the manufacturing process of the semiconductor memory device.

The critical size of the bit line in the traditional manufacturing process of the semiconductor memory device is small. According to the specific product requirements, the critical size of the bit line may be less than 10 nm. In order to meet the requirements of the manufactured semiconductor memory device on the electrical performance parameters of the bit line, the height of the bit line may be higher than 200 nm. Generally, multiple etching, wet cleaning and other processes need to be adopted to obtain the target bit line structure.

However, in the process of forming the bit line structure, since the critical size of the bit line is small and the height of the bit line is relatively high, the bit line structure in the manufactured semiconductor device structure is relatively fragile. Thus, torsion, inclination, collapse of the bit line structure may frequently occur during a formation process, which not only affects the electrical performance parameters and the signal transmission quality of the bit line, but may also cause the failure to open a capacitance contact hole.

SUMMARY

According to various embodiments of the disclosure, a method for preparing a semiconductor structure and a semiconductor structure are provided.

According to one aspect of the disclosure, a method for preparing a semiconductor structure is provided, which includes the following operations.

A substrate is provided.

A first conductive material layer, a barrier material layer, a second conductive material layer and a first dielectric material layer stacked onto one another are successively arranged on the substrate.

A supporting layer is formed on the first dielectric material layer, in which the supporting layer includes a plurality of supporting pattern structures spaced apart from each other, the supporting pattern structures extend along a first direction, and a first trench is provided between two adjacent supporting pattern structures.

A second dielectric layer is formed, in which the second dielectric layer fills the first trench, and an upper surface of the second dielectric layer is flush with an upper surface of the supporting layer.

A portion of the second dielectric layer, a portion of the first dielectric material layer, a portion of the second conductive material layer, a portion of the barrier material layer and a portion of the first conductive material layer are removed, so as to form a bit line array, in which the bit line array includes a plurality of bit line structures spaced apart from each other, the bit line structures extend along a second direction, the second direction is orthogonal to the first direction, and each of the supporting pattern structures penetrates through the bit line array.

A bit line protective layer is formed, in which the bit line protective layer at least covers a side wall of each of the bit line structures.

According to another aspect of the disclosure, a semiconductor structure is provided. The semiconductor structure is prepared by the method for preparing the semiconductor structure in any one of the embodiments of the disclosure.

BRIEF DESCRIPTION OF THE DRAWINGS

In order to better describe and illustrate the embodiments and/or examples of whose applications disclosed herein, reference may be made to one or more of the drawings. The additional details or examples used to describe the drawings are not to be construed as limiting the scope of any of the disclosed application, the presently described embodiments and/or examples, and the best model for these applications which is currently understood.

DETAILED DESCRIPTION

Figure 1:
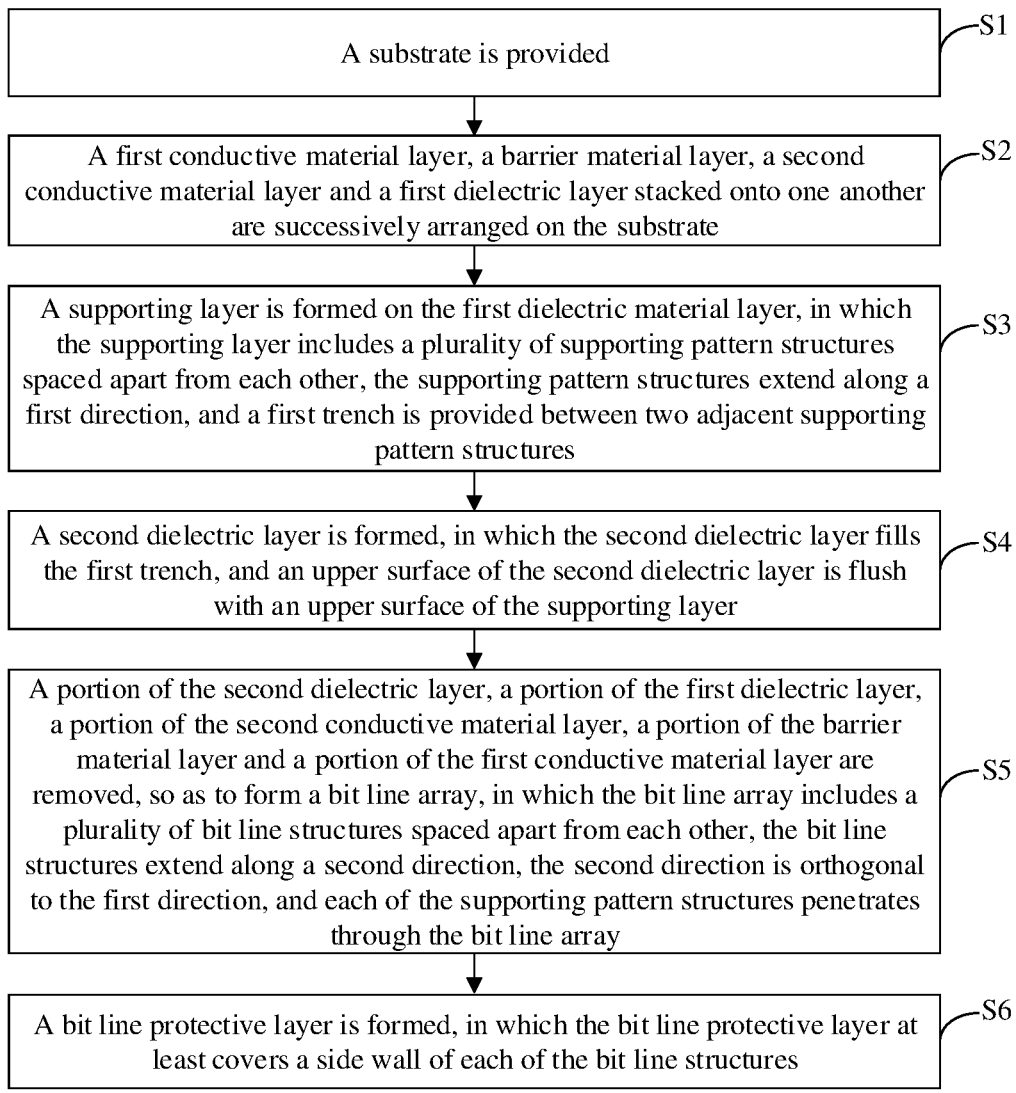
FIG. 1 is a flowchart of a method for preparing a semiconductor structure according to an embodiment of the disclosure.

In order to facilitate understanding of the disclosure, the disclosure will be described more fully hereinafter with reference to the accompanying drawings. Preferred embodiments of the disclosure are illustrated in the accompanying drawings. However, the disclosure may be embodied in many different forms and is not limited to the embodiments described herein. Rather, these embodiments are provided for the purpose of making a disclosure of the disclosure more comprehensive.

Unless defined otherwise, all technical and scientific terms used herein have the same meanings as commonly understood by those skilled in the art to which the disclosure belongs. The terminology used in the specification of the disclosure is for a purpose of describing specific embodiments only and is not intended to limit the disclosure. The term "and/or" used herein includes any and all combinations of one or more of the associated listed items.

It should be understood that when elements or layers are referred to as "on", "adjacent to", "connected to", or "coupled to" other elements or layers, it may be directly on, adjacent to, connected to, or coupled to other elements or layers, or intermediate elements or layers may present. On the contrary, when the element is called "directly on", "directly adjacent to", "directly connected to" or "directly coupled to" other elements or layers, there is no intermediate element or layer. It should be understood that, although the terms first, second and third may be used to describe elements, components, areas, layers and/or parts, those elements, components, areas, layers and/or parts should not be limited by those terms. These terms are used only to distinguish one element, component, area, layer or part from another element, component, area, layer or part. Therefore, the first element, component, area, layer or part discussed below may be represented as a second element, component, area, layer or part without departing from the teaching of the disclosure.

Spatially relational terms such as "below", "under", "lower", "beneath", "on", and "upper" may be used herein for convenience of description to describe the relationship between an element or feature shown in the drawings and other elements or features. It should be understood that, other than the orientation shown in the figures, the spatially relational terms includes different orientations of the devices in use and operation. For example, if the device in the drawings is reversed, then elements or features described as "under other elements", or "below", or "beneath" will be oriented to "above" other elements or features. Therefore, the exemplary terms "under" and "below" may include both upper and lower orientations. The device may be otherwise oriented (rotated by 90 degrees or other orientations) and the spatial descriptors used herein are interpreted accordingly.

The term used herein is intended only to describe specific embodiments and is not a limitation of the disclosure. In this case, the singular forms "a/an", "one", and "the/said" are also intended to include the plural forms, unless the context clearly indicates otherwise. The terms "composition" and/or "including" shall also be understood and, when used in the specification, the presence of the features, integers, steps, operations, elements, and/or components described, without rule out the presence or addition of one or more other features, integers, steps, operations, elements, components. When used herein, the term "and/or" includes any and all combinations of the related listed items.

Embodiments of the disclosure are described herein with reference to cross-section illustrations of schematic representations of the preferred embodiments (and intermediate structures) of the disclosure. Thus, variations from the shapes shown may be expected as a result, for example, of manufacturing techniques and/or tolerances. Therefore, embodiments of the disclosure shall not be limited to the specific shape of the regions illustrated herein, but shall include variations in the shape, for example, a shape variation due to manufacturing. The regions shown in the figures are therefore schematic in nature and their shapes are not intended to limit the scope of the disclosure.

Referring to FIG. 1 to FIG. 13, it should be noted that the drawings provided by the embodiments below merely illustrate the basic concept of the disclosure in a schematic manner. The drawings merely show the components related to the disclosure, rather than the numbers, shapes and sizes of components in the actual implementation. In the actual implementation, the type, quantity and proportion of each component may be changed arbitrarily, and the layout of the components may be more complicated.

Referring to FIG. 1, in one embodiment of the disclosure, a method for preparing a semiconductor structure is provided, which includes the following operations.

In S1, a substrate is provided.

In S2, a first conductive material layer, a barrier material layer, a second conductive material layer and a first dielectric material layer stacked onto one another are successively arranged on the substrate.

In S3, a supporting layer is formed on the first dielectric material layer, in which the supporting layer includes a plurality of supporting pattern structures spaced apart from each other, the supporting pattern structures extend along a first direction, and a first trench is provided between two adjacent supporting pattern structures.

In S4, a second dielectric layer is formed, in which the second dielectric layer fills the first trench, and an upper surface of the second dielectric layer is flush with an upper surface of the supporting layer.

In S5, a portion of the second dielectric layer, a portion of the first dielectric material layer, a portion of the second conductive material layer, a portion of the barrier material layer and a portion of the first conductive material layer are removed, so as to form a bit line array. Herein, the bit line array includes a plurality of bit line structures spaced apart from each other, the bit line structures extend along a second direction, the second direction is orthogonal to the first direction, and each of the supporting pattern structures penetrates through the bit line array.

In S6, a bit line protective layer is formed, in which the bit line protective layer at least covers a side wall of each of the bit line structures.

Figure 2:
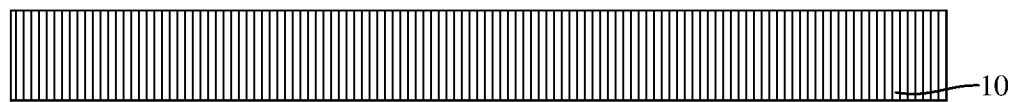
FIG. 2 is a schematic diagram of a cross section of a structure obtained after S1 in a method for preparing a semiconductor structure according to an embodiment of the disclosure.

In S1, referring to S1 in FIG. 1, and FIG. 2, a substrate 10 is provided. The substrate 10 may include, but not limited to, a silicon substrate, a silicon germanium substrate, a Silicon-On Insulator (SOI) substrate, etc. The material of the substrate is silicon, germanium or silicon germanium. Those skilled in the art may select the type of the substrate according to the type of a transistor formed on the substrate. Therefore, the type of the substrate should not limit the protection scope of the disclosure. The substrate 10 may include a word line structure, a capacitance contact structure and the like, which are omitted because they are unrelated to this solution.

Figure 3:
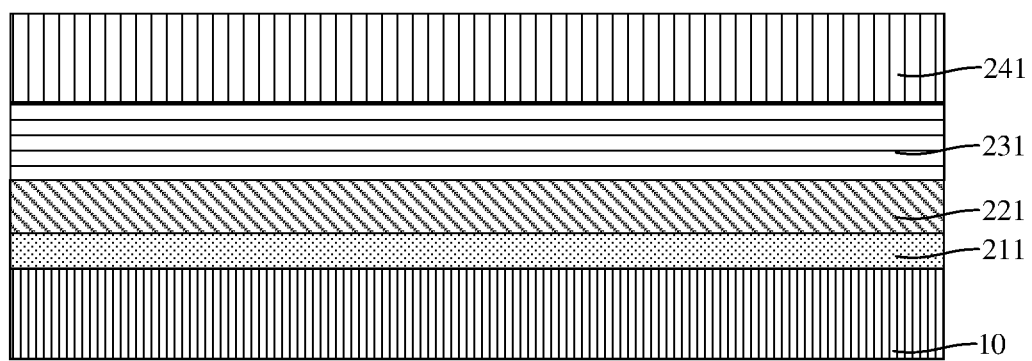
FIG. 3 is a schematic diagram of a cross section of a structure obtained after S2 in a method for preparing a semiconductor structure according to an embodiment of the disclosure.

In S2, referring to S2 in FIG. 1, and FIG. 3, the first conductive material layer 211, the barrier material layer 221, the second conductive material layer 231 and the first dielectric material layer 241 stacked onto one another are successively arranged on the substrate 10, so as to prepare a bit line structure. It may adopt, but not limited to, a deposition process, to form the first conductive material layer 211, the barrier material layer 221, the second conductive material layer 231 and the first dielectric material layer 241. The first conductive material layer 211 may include, but not limited to, a polycrystalline silicon layer. The barrier material layer 221 may include, but not limited to, a titanium nitride layer. The second conductive material layer 231 may include, but not limited to, a tungsten layer. The first dielectric material layer 241 may include, but not limited to, a silicon nitride layer. Herein, the deposition process may be one or more of a Chemical Vapor Deposition (CVD) process, an Atomic Layer Deposition (ALD) process, a High Density Plasma (HDP) process and a plasma enhanced deposition process.

Figure 4:
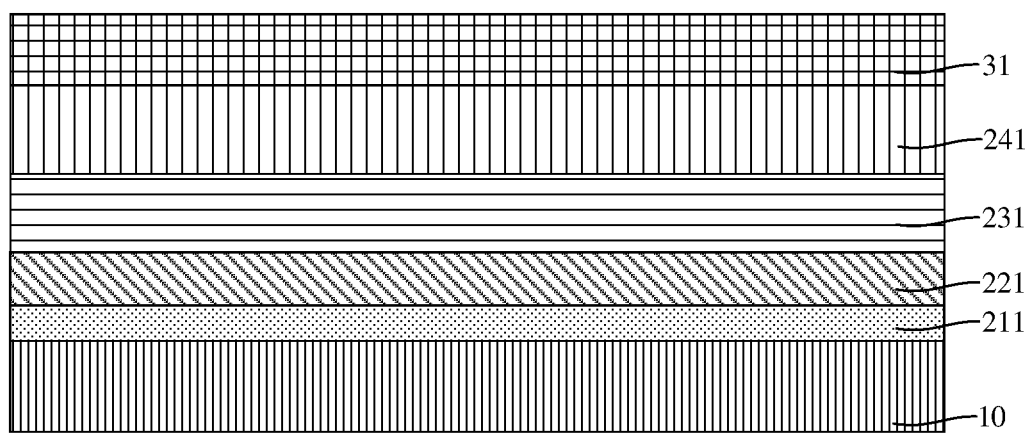
FIG. 4 and FIG. 5 are schematic diagrams of a cross section of a structure obtained after S3 in a method for preparing a semiconductor structure according to an embodiment of the disclosure.
Figure 5:
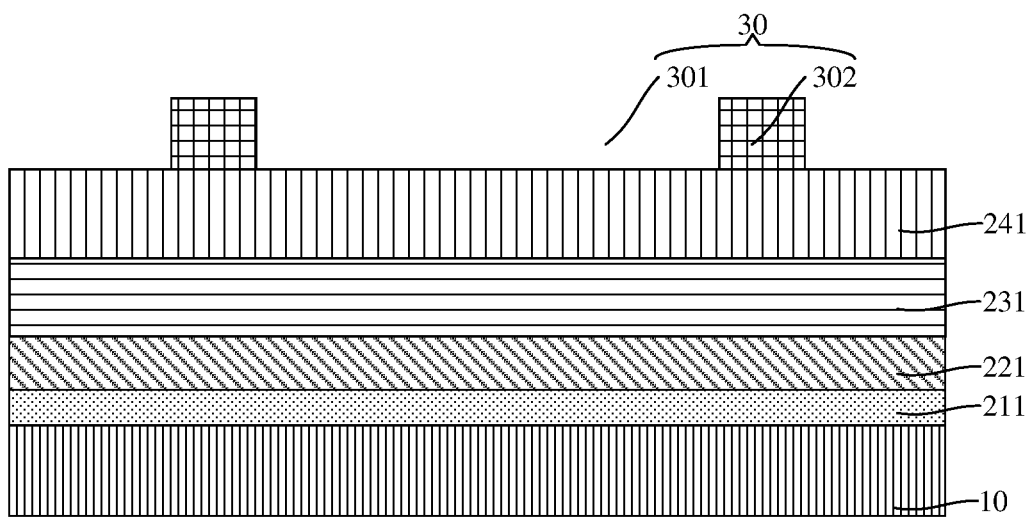

In S3, referring to S3 in FIG. 1, and FIG. 4 and FIG. 5, the supporting layer 30 is formed on the first dielectric material layer 241. The supporting layer 30 includes the plurality of supporting pattern structures 302 spaced apart from each other, the supporting pattern structures 302 extend along the first direction, and the first trench 301 is provided between two adjacent supporting pattern structures 302.

As an example, still referring to S3 in FIG. 1, and FIG. 4 and FIG. 5, in S3, the operation that the supporting layer 30 is formed on an upper surface of the first dielectric material layer 241 includes the following operations.

In S31, a supporting material layer 31 is formed on the first dielectric material layer 241, in which the supporting material layer 31 covers the upper surface of the first dielectric material layer 241.

In S32, by using the first dielectric material layer as an etch stop layer, a portion of the supporting material layer 31 is etched through a dry etching process, so as to form the supporting layer 30.

As an example, in one embodiment of the disclosure, a material forming the first dielectric material layer 241 includes silicon nitride. In a process of etching the supporting material layer 31 through the dry etching process, if an optical emission spectrum of the first dielectric material layer 241 is detected, etching is stopped.

As an example, in one embodiment of the disclosure, in S3, the operation that the supporting layer 30 is form includes the following operations.

Under a same condition, an etching selectivity ratio of the supporting material layer 31 to the first dielectric material layer 241 is greater than 10:1.

By setting the etching selectivity ratio of the supporting material layer 31 to the first dielectric material layer 241 under the same condition to be greater than 10:1, in the process of etching the portion of the supporting material layer 31 through the dry etching process by using the first dielectric material layer 241 as an etch stop layer and forming the supporting layer 30, the situation that the heights of the bottom portions of the first trenches 301 between two adjacent supporting pattern structures 302 are different from each other can be avoided, thereby effectively improving the morphology and the structural strength of the supporting pattern structures 302.

As an example, in one embodiment of the disclosure, a material forming the supporting material layer 31 includes silicon carbon nitride, and the material forming the first dielectric material layer 241 includes silicon nitride. In this way, the supporting pattern structures 302 configured to support the bit line structures are formed before preparing the bit line structures through the etching process, so that each of the supporting pattern structures 302 provides the supporting force to the bit line structures, thereby improving the structural strength of each of the bit line structures, and avoiding the torsion, inclination and collapse of the bit line structures during the formation process of the bit line structures.

Figure 6:
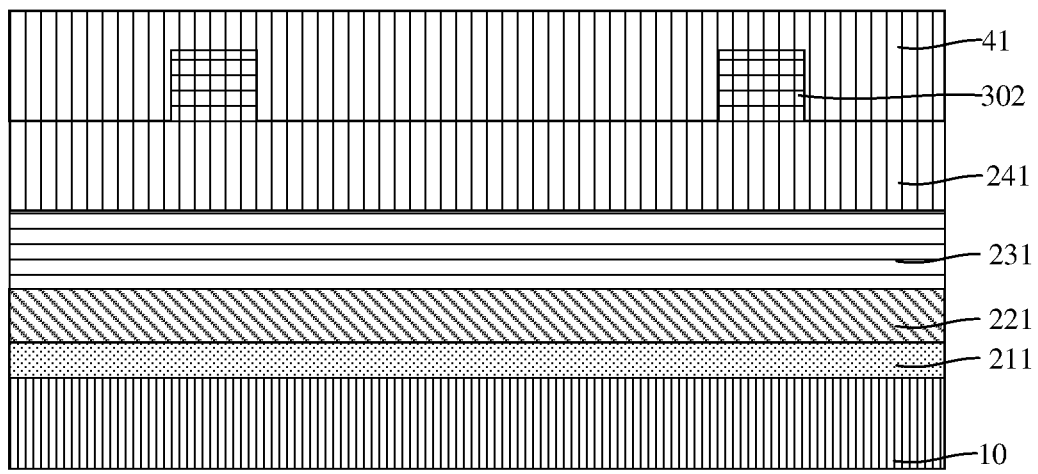
FIG. 6 and FIG. 7 are schematic diagrams of a cross section of a structure obtained after S4 in a method for preparing a semiconductor structure according to an embodiment of the disclosure.
Figure 7:
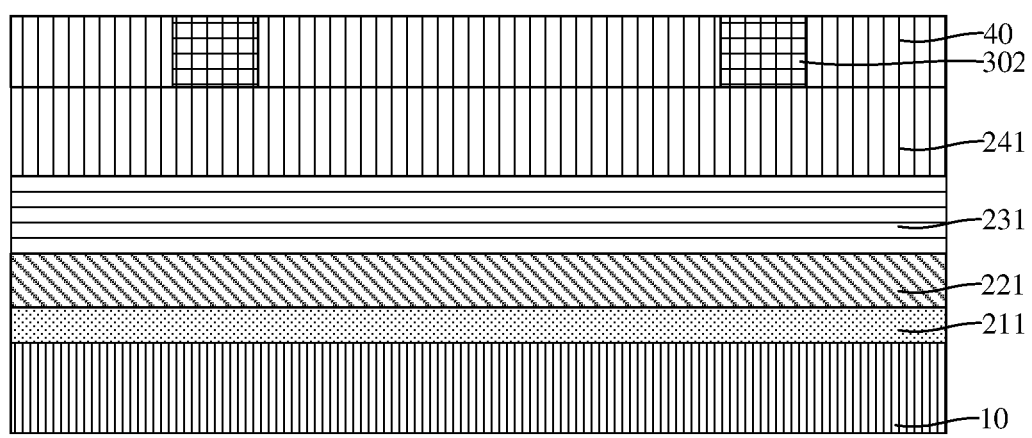
Figure 8A:
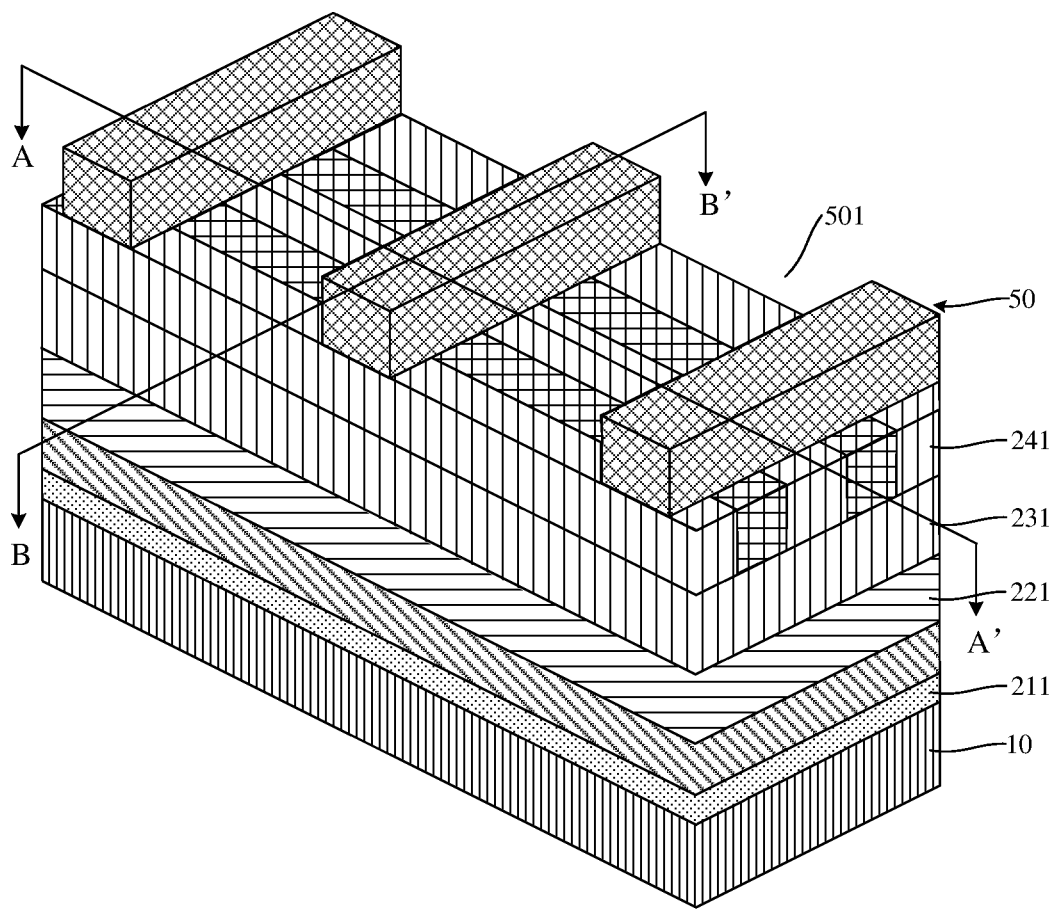
FIG. 8A and FIG. 9A are perspective views of a structure obtained after S5 in a method for preparing a semiconductor structure according to an embodiment of the disclosure.
Figure 8B:
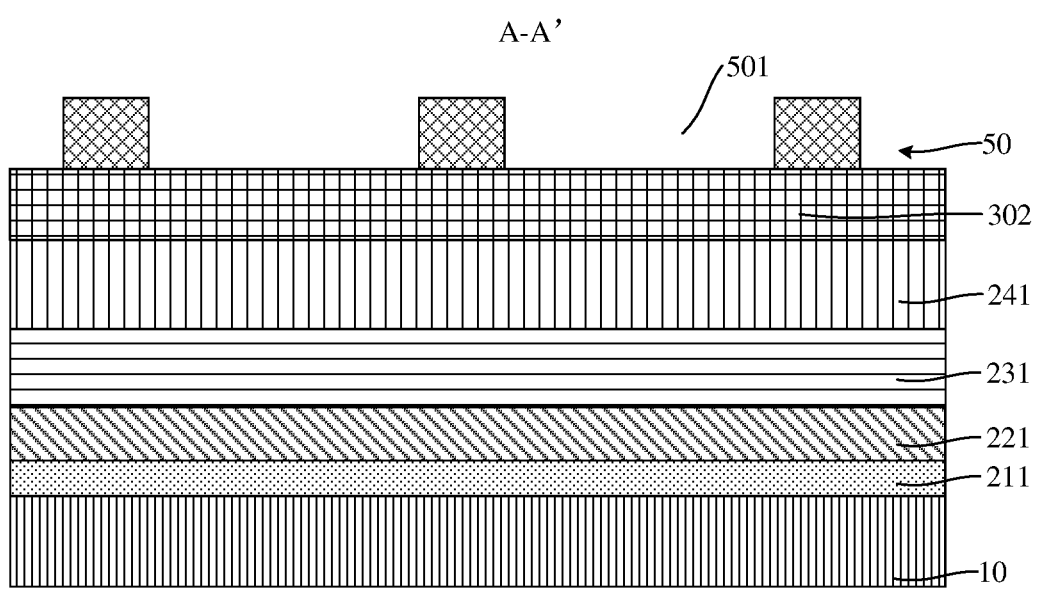
FIG. 8B is sectional schematic diagram of a structure shown in FIG. 8A along an AA' direction.
Figure 8C:
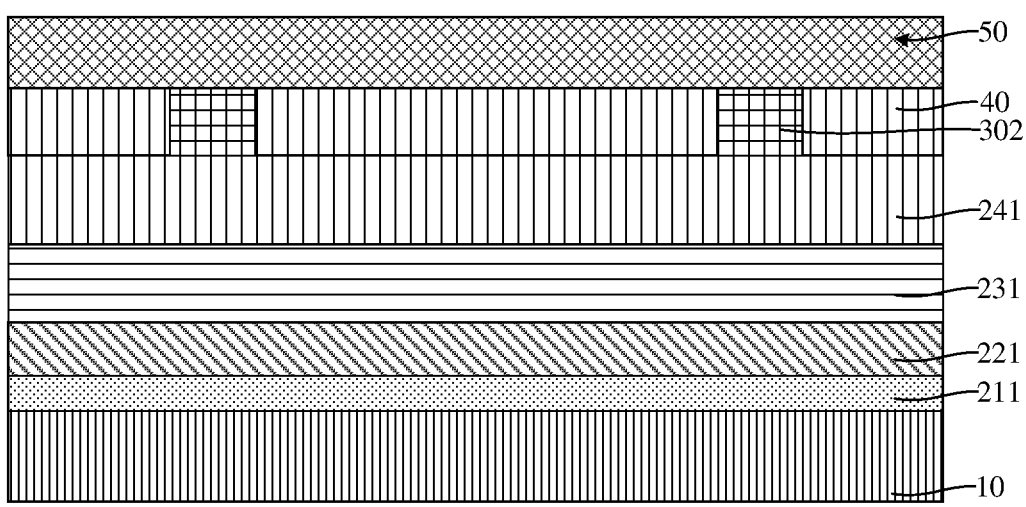
FIG. 8C is sectional schematic diagram of a structure shown in FIG. 8A along a BB' direction.
Figure 9A:
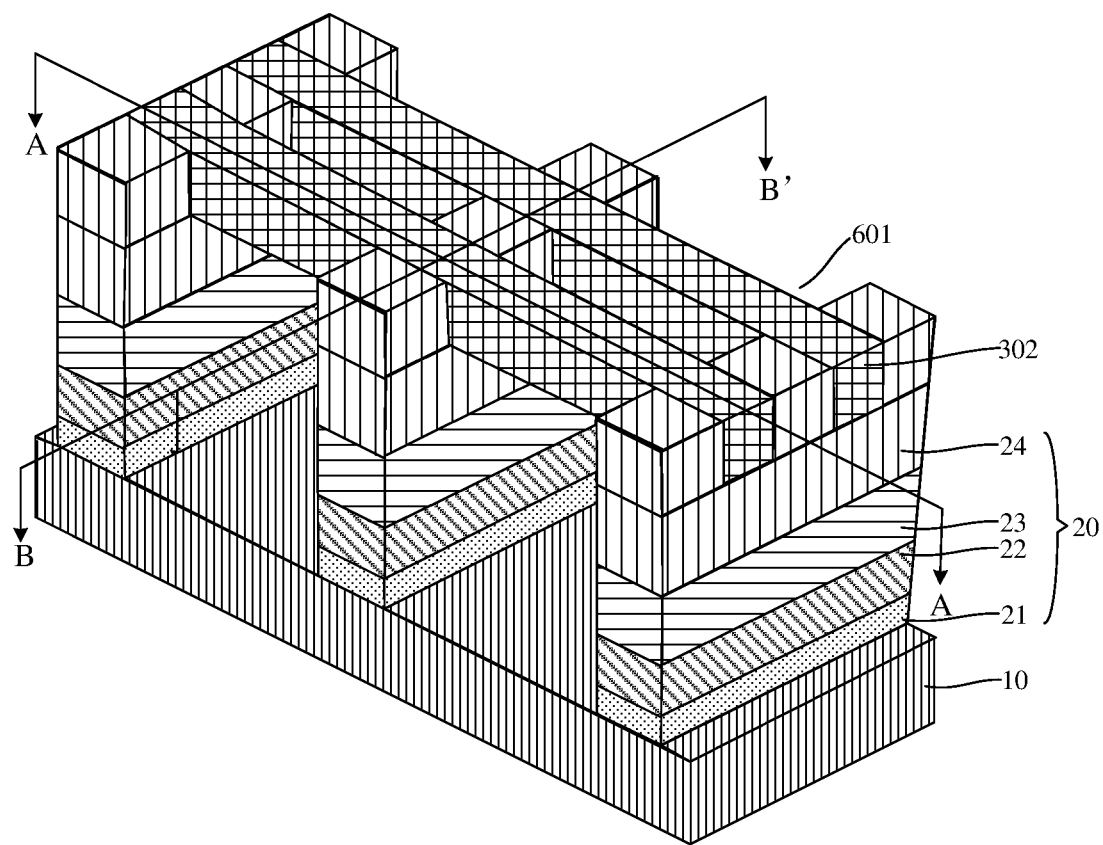
Figure 9B:
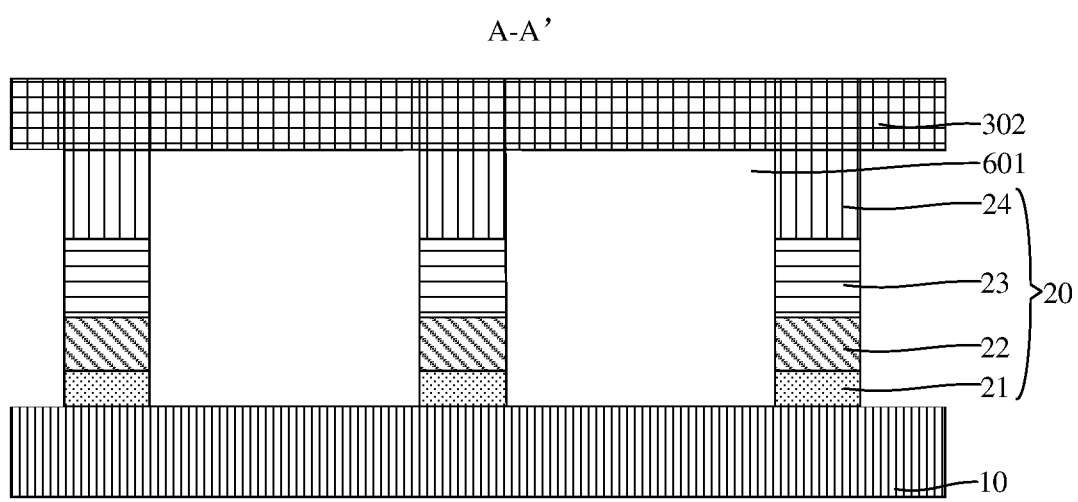
FIG. 9B is sectional schematic diagram of a structure shown in FIG. 9A along an AA' direction.
Figure 9C:
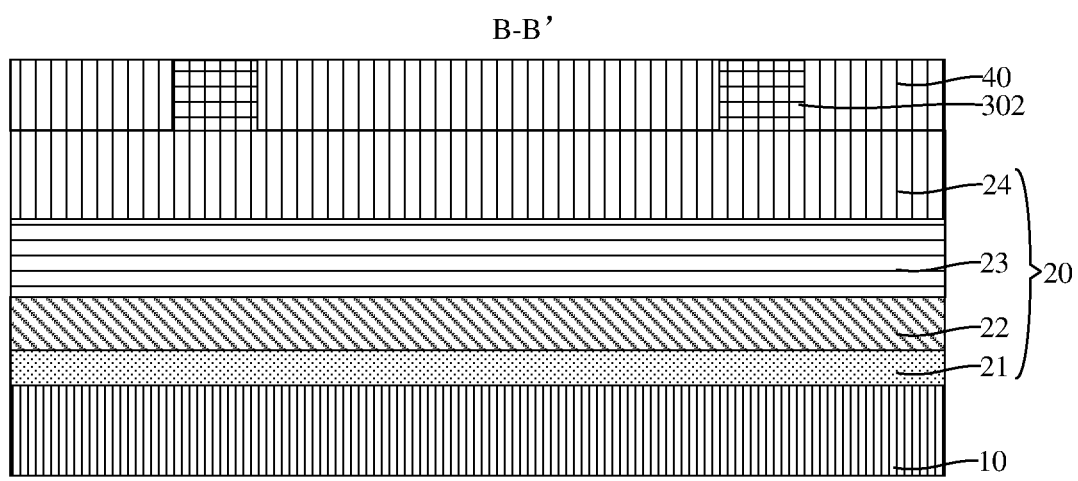
FIG. 9C is sectional schematic diagram of a structure shown in FIG. 9A along a BB' direction.
Figure 10A:
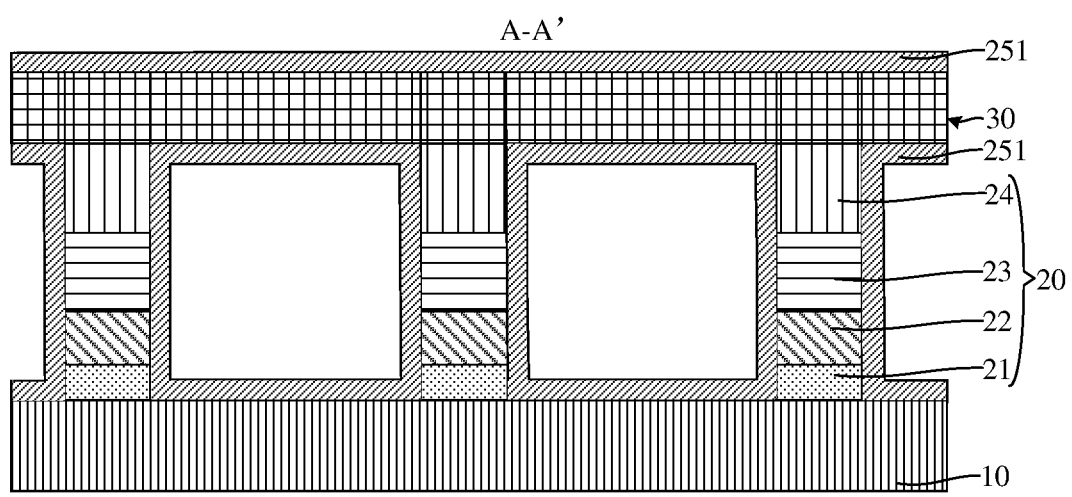
FIG. 10A and FIG. 11A are sectional schematic diagrams of a structure obtained after S6 in a method for preparing a semiconductor structure according to an embodiment of the disclosure along an AA' direction.
Figure 10B:
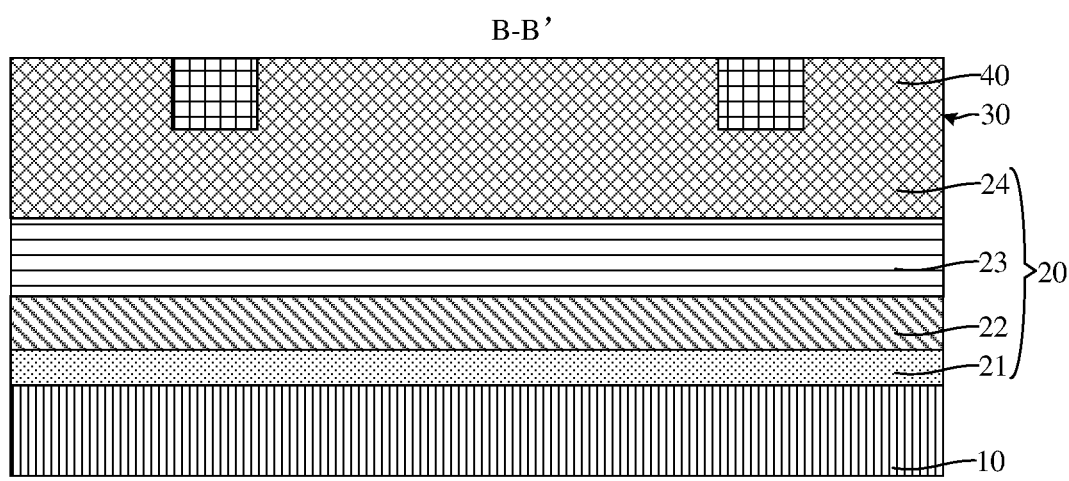
FIG. 10B and FIG. 11B are sectional schematic diagrams of a structure obtained after S6 in a method for preparing a semiconductor structure according to an embodiment of the disclosure along a BB' direction.
Figure 11A:
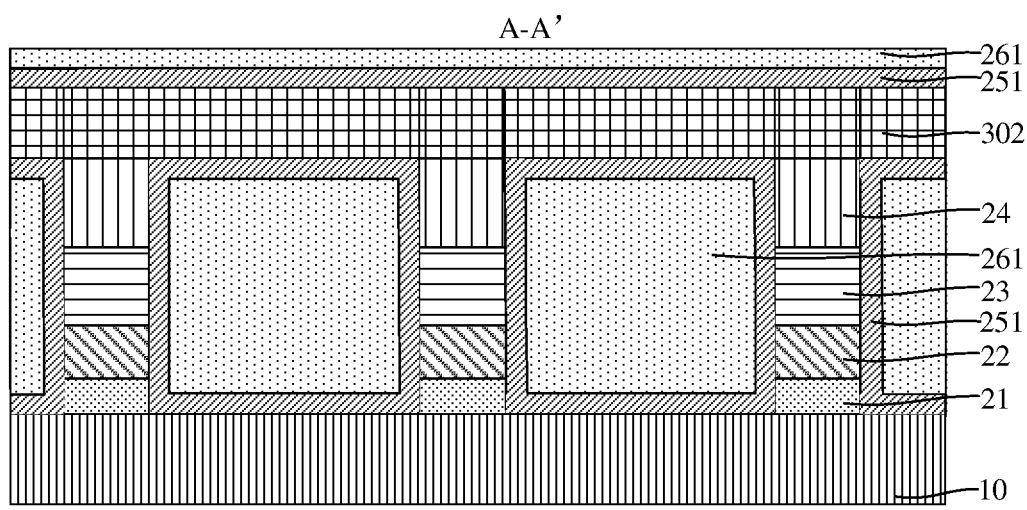
Figure 11B:
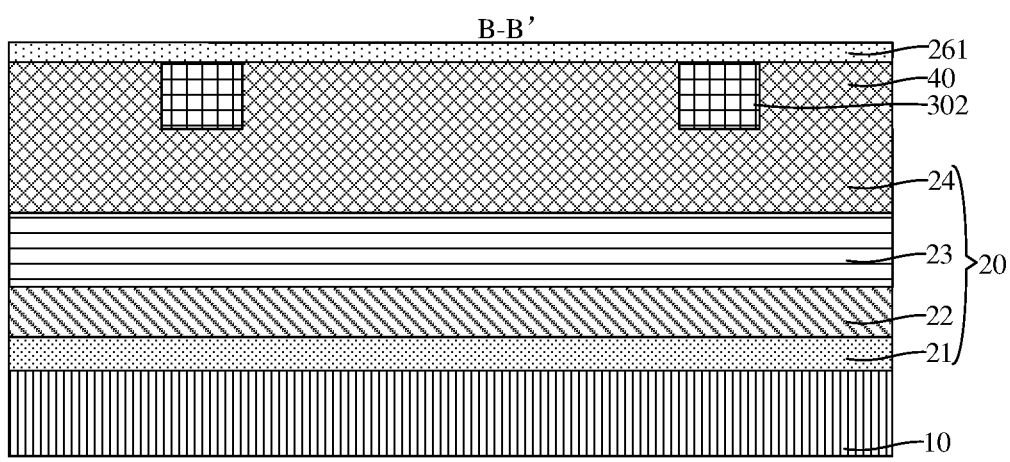

As an example, still referring to S4 in FIG. 1, and FIG. 6 and FIG. 7, in S4, the operation that the second dielectric layer 40 is formed, in which the second dielectric layer 40 fills the first trench 301, and the upper surface of the second dielectric layer 40 is flush with the upper surface of the supporting layer 30, includes the following operations.

In S41, a second dielectric material layer 41 is formed on the supporting layer 30, in which the second dielectric material layer 41 covers the upper surface of the supporting layer 30, and fills the first trench 301.

In S42, by using the supporting layer 30 as a stop layer, a portion of the second dielectric material layer 41 is removed through a planarization process, so that a remaining portion of the second dielectric material layer 41 forms the second dielectric layer 40.

As an example, in S41, the second dielectric material layer 41 may be formed on the supporting layer 30 through the ALD process. The second dielectric material layer 41 covers the upper surface of the supporting layer 30, and fills the first trench 301. The deposition temperature is comprised between 500° C. and 700° C. For example, the deposition temperature may be 500° C., 550° C., 600° C., 650° C. or 700° C. It can be understood that the above data is only for illustration. In an actual embodiment, the deposition temperature for forming the second dielectric material layer 41 is not limited to the above data.

As an example, the material forming the first dielectric material layer 241 is the same as the material forming the second dielectric material layer 41. For example, the material forming the first dielectric material layer 241 and the material forming the second dielectric material layer 41 are both silicon nitride.

As an example, in S42, by using the supporting layer 30 as a stop layer, the portion of the second dielectric material layer 41 may be removed through a chemical mechanical polishing process, so that the remaining portion of the second dielectric material layer 41 forms the second dielectric layer 40, and the upper surface of the second dielectric layer 40 is flush with the upper surface of the supporting layer 30.

As an example, still referring to S5 in FIG. 1, and FIG. 8A to FIG. 9C, in S5, the operation that the bit line array is formed includes the following operations.

In S51, a first patterned photoresist layer 50 is formed on the upper surface of the second dielectric layer 40, in which the first patterned photoresist layer 50 is provided with a first opening 501, and the first opening 501 is configured to limit a shape and a position of each of the bit line structures 20.

In S52, by using the first patterned photoresist layer 50 as a mask, the portion of the second dielectric layer 40, the portion of the first dielectric material layer 241, the portion of the second conductive material layer 231, the portion of the barrier material layer 221 and the portion of the first conductive material layer 211 are etched, so as to form a second trench 601. The second trench 601 exposes the side wall of each of the bit line structures 20.

As an example, still referring to S5 in FIG. 1, and FIG. 8A to FIG. 9C, in S52, the operation that the second trench 601 is formed includes the following operations.

In S521, by using the first patterned photoresist layer 50 as a mask, the portion of the second dielectric layer 40, the portion of the first dielectric material layer 241, the portion of the second conductive material layer 231, the portion of the barrier material layer 221 and the portion of the first conductive material layer 211 are removed through the dry etching process, so as to form the second trench 601. The remaining portion of the first dielectric material layer 241 forms a first dielectric layer 24, the remaining second conductive material layer 231 forms a second conductive layer 23, the remaining portion of the barrier material layer 221 forms a barrier layer 22, and the remaining portion of the first conductive material layer 211 forms a first conductive layer 21. Herein, the first conductive layer 21, the barrier layer 22, the second conductive layer 23 and the first dielectric layer 24 which are successively stacked onto one another form a bit line structure 20, and the second trench 601 exposes the side wall of each of the bit line structures 20.

As an example, in one embodiment of the disclosure, a width of each of the supporting pattern structures 302 is ½ to 1 of a width of each of the bit line structures 20. For example, the width of each of the supporting pattern structures 302 may be 0.5, 0.75, 0.9 or 1 of the width of each of the bit line structures 20. The supporting pattern structures 302 are narrower, which may ensure that the first dielectric material layer 241, the second conductive material layer 231, the barrier material layer 221 and the first conductive material layer 211 below the supporting pattern structures 302 are easily removed by adjusting the parameters of the etching process.

As an example, in S521, in the process of removing, by using the first patterned photoresist layer 50 as a mask, the portion of the second dielectric layer 40, the portion of the first dielectric material layer 241, the portion of the second conductive material layer 231, the portion of the barrier material layer 221 and the portion of the first conductive material layer 211 through the dry etching process to form the second trench 601, the first dielectric material layer 241, the second conductive material layer 231, the barrier material layer 221 and the first conductive material layer 211 below the supporting pattern structures 302 are easily removed by adjusting the parameters of the etching process (such as gas flow, ratio of different gases, gas etching angle, plasma energy, etc.), so that the second trench 601 exposes the side wall of each of the bit line structures 20, thereby facilitating the formation of a bit line protective layer subsequently.

As an example, still referring to S6 in FIG. 1, and FIG. 10A to FIG. 13C, in S6, the operation that the bit line protective layer 25 is formed includes the following operations.

In S61, a bit line protective material layer 251 is formed, in which the bit line protective material layer 251 at least covers the side wall of each of the bit line structures 20 and a surface of the supporting layer 30.

In S62, a sacrificial layer 26 is formed, in which the sacrificial layer 26 fills the second trench 601, and an upper surface of the sacrificial layer 26 is flush with the upper surface of the supporting layer 30.

In S63, the supporting layer 30, the second dielectric layer 40, a portion of the sacrificial layer 26 and a portion of the bit line protective material layer 251 are removed, in which a remaining portion of the bit line protective material layer 251 forms the bit line protective layer 25.

In S64, the sacrificial layer 26 is removed.

As an example, still referring to S6 in FIG. 1, and FIG. 10A to FIG. 13C, in one embodiment of the disclosure, in S62, the operation that the sacrificial layer 26 is formed includes the following operations.

In S621, a sacrificial material layer 261 is formed, in which the sacrificial material layer 261 covers the upper surface of the second dielectric layer 40 and the upper surface of the supporting layer 30, and fills the second trench 601.

In S622, by using the supporting layer 30 as a stop layer, a portion of the sacrificial material layer 261 is removed through a planarization process, in which a remaining portion of the sacrificial material layer 261 forms the sacrificial layer 26.

As an example, in S622, by using the supporting layer 30 as a stop layer, the portion of the sacrificial material layer 261 may be removed through the chemical mechanical polishing process, so that the remaining portion of the sacrificial material layer 261 forms the sacrificial layer 26, and the upper surface of the sacrificial layer 26 is flush with the upper surface of the supporting layer 30.

As an example, in one embodiment of the disclosure, in S621, the operation that the sacrificial material layer 261 is formed includes the following operation.

In S6211, the sacrificial material layer is formed through a spin on dielectric process.

The sacrificial material layer 261 includes, but is not limited to, an electrical and thermal insulating oxide. For example, the sacrificial material layer 261 is silicon oxide. The second trench 601 may be filled with filling material through the ALD process, the CVD process, the Spin on Dielectric (SOD) process and other processes. An air gap may be provided in the sacrificial material layer 261. For example, at least one air gap may be formed in the sacrificial material layer 261, air or other gases are filled in the air gap.

In this way, a better electrical and thermal insulation effect is achieved by using the air gap.

Figure 12A:
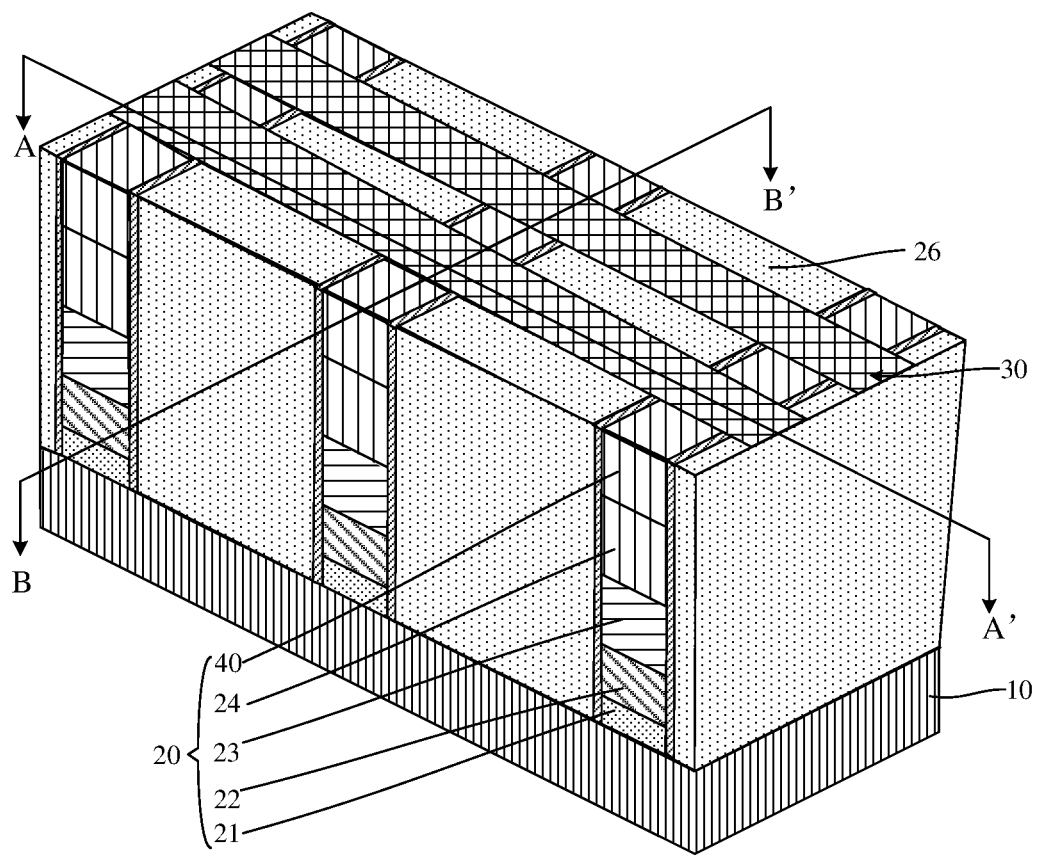
FIG. 12A and FIG. 13A are perspective views of a structure obtained after S6 in a method for preparing a semiconductor structure according to an embodiment of the disclosure.
Figure 12B:
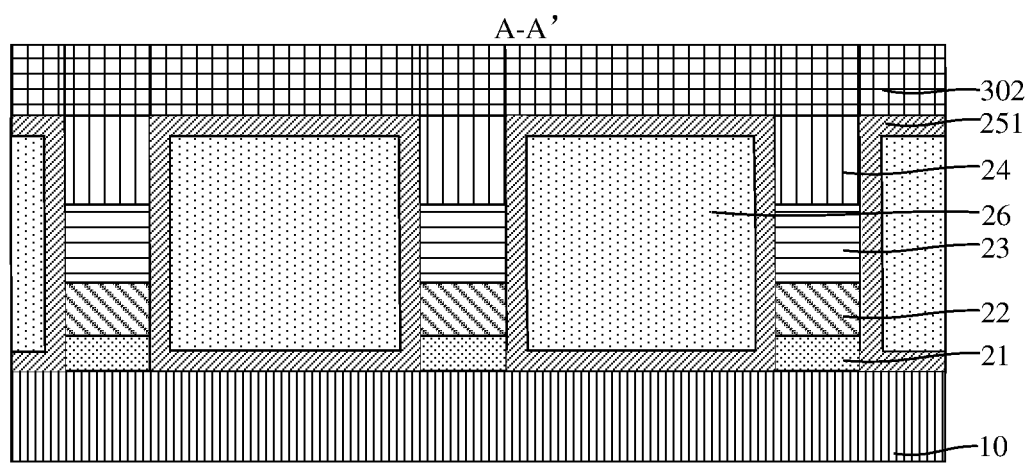
FIG. 12B is sectional schematic diagram of a structure shown in FIG. 12A along an AA' direction.
Figure 12C:
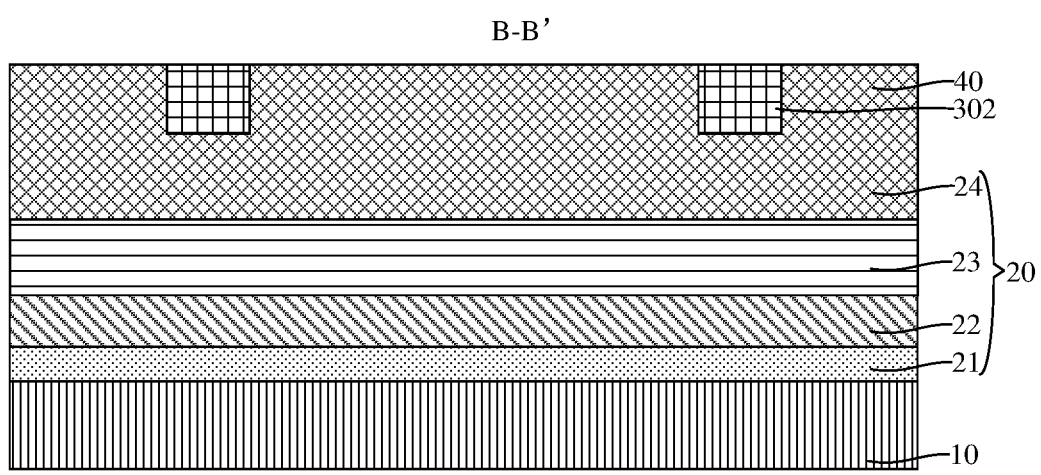
FIG. 12C is sectional schematic diagram of a structure shown in FIG. 12A along a BB' direction.
Figure 13A:
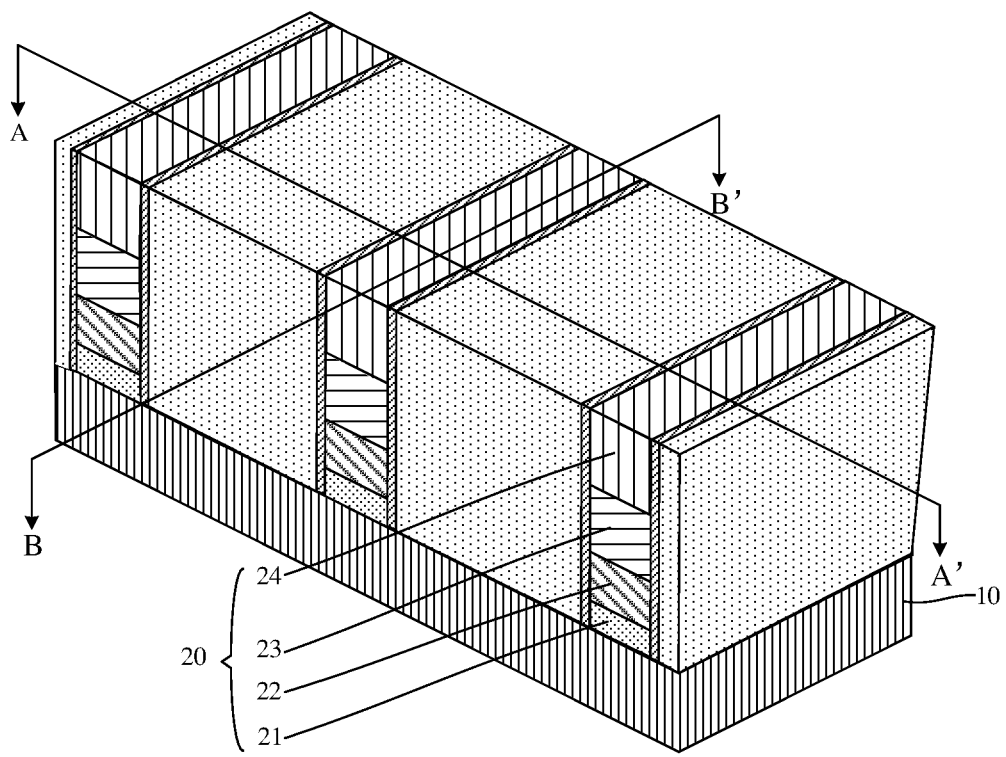
Figure 13B:
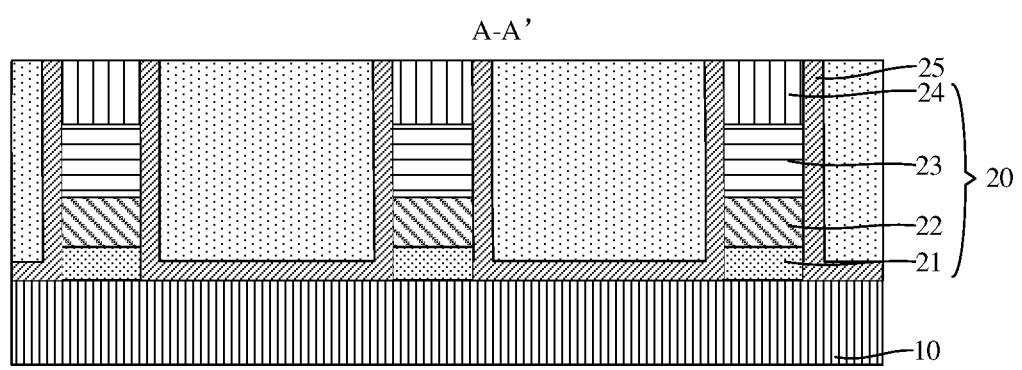
FIG. 13B is sectional schematic diagram of a structure shown in FIG. 13A along an AA' direction.
Figure 13C:
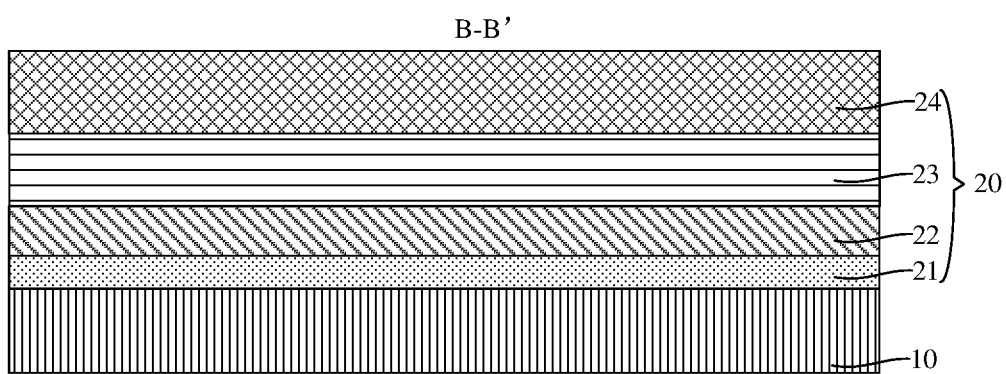
FIG. 13C is sectional schematic diagram of a structure shown in FIG. 13A along a BB' direction.

As an example, still referring to FIG. 12A and FIG. 12B, in one embodiment of the disclosure, in S63, by using the first dielectric material layer 241 as a stop layer, the supporting layer 30, the second dielectric layer 40, the portion of the sacrificial layer 26 and the portion of the bit line protective material layer 251 may be removed through the chemical mechanical polishing process, so that the remaining portion of the bit line protective material layer 251 forms the bit line protective layer 25.

As an example, in one embodiment of the disclosure, a width of each of the bit line structures is comprised between 5 nm and 10 nm. For example, the width of the bit line may be 5 nm, 7 nm, 9 nm or 10 nm, etc.

As an example, in one embodiment of the disclosure, the bit line protective layer 25 includes a first bit line protective layer 2501, a second bit line protective layer 2502 and a third bit line protective layer 2503 which are successively stacked onto one another. A material forming the first bit line protective layer 2501 is the same as a material forming the third bit line protective layer 2503.

Figure 14A:
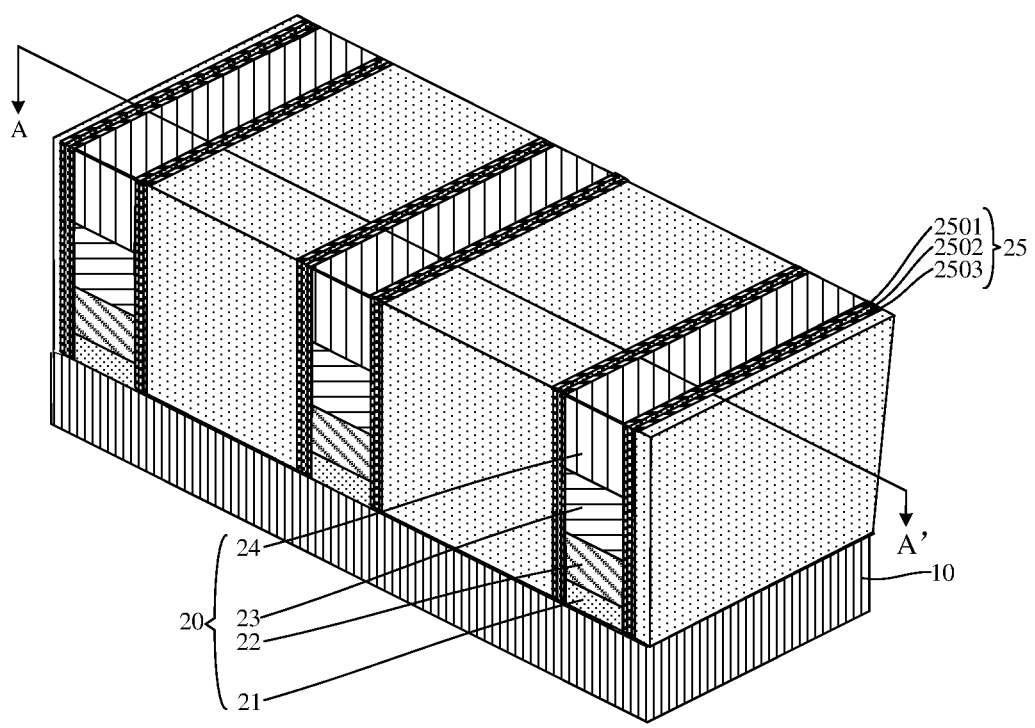
FIG. 14A is a perspective view of a semiconductor structure according to an embodiment of the disclosure.
Figure 14B:
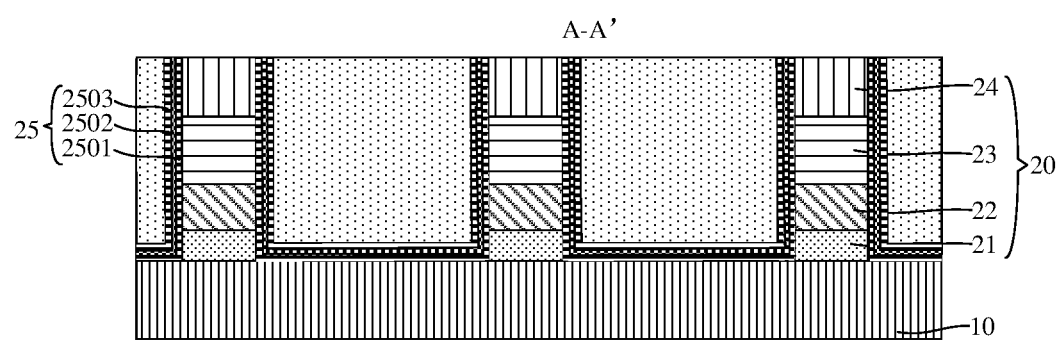
FIG. 14B is sectional schematic diagram of a structure shown in FIG. 14A along an AA' direction.

As an example, referring to FIG. 14A and FIG. 14B, in one embodiment of the disclosure, the material forming the first bit line protective layer 2501 and the material forming the third bit line protective layer 2503 are both silicon nitride, and a material forming the second bit line protective layer 2502 is silicon oxide.

As an example, still referring to FIG. 14A and FIG. 14B, in one embodiment provided by the disclosure, a semiconductor structure is provided. The semiconductor structure is prepared by the method for preparing the semiconductor structure in any one of the embodiments of the disclosure.

It should be understood that, although the steps in the flowcharts of FIG. 1 are shown in orders as indicated by the arrows, the steps are not necessarily performed in order as indicated by the arrows. The steps are not performed in the exact order shown and may be performed in other orders unless otherwise indicated herein. Moreover, at least a portion of the steps in FIG. 1 may include multiple sub-steps or multiple stages, which are not necessarily performed at the same time, but may be performed at different times, and the order of execution is not necessarily sequential, but may be performed in turns or alternately with other steps or at least a portion of the sub-steps or stages of other steps.

In conclusion, according to the method for preparing the semiconductor structure and the semiconductor structure provided by the disclosure, firstly, the first conductive material layer 211, the barrier material layer 221, the second conductive material layer 231 and the first dielectric material layer 241 stacked onto one another are successively arranged on the substrate 10, so as to prepare the bit line structures 20. And then the supporting layer 30 is formed on the first dielectric material layer 241. The supporting layer 30 includes the plurality of supporting pattern structures 302 spaced apart from each other, the supporting pattern structures 302 extend along the first direction, and the first trench 301 is provided between two adjacent supporting pattern structures 302, so that the supporting pattern structures 302 for supporting the bit line structure are formed before preparing the bit line structures 20 through the etching process. After forming the supporting pattern structures 302 which extend along the first direction and between which the first trench 301 is provided, the portion of the second dielectric layer 40, the portion of the first dielectric material layer 241, the portion of the second conductive material layer 231, the portion of the barrier material layer 221 and the portion of the first conductive material layer 211 are removed through the etching process, so as to form the bit line structures 20. The bit line structures 20 extend along the second direction, and the second direction is orthogonal to the first direction, so that each of the supporting pattern structures 302 penetrates through an array of the bit line structures 20 to provide the supporting force to the bit line structures 20. In this way, the structural strength of each of the bit line structures 20 is improved, and the torsion, inclination and collapse of the bit line structures 20 can be avoided during the formation process of the bit line structures 20. Due to the support of the supporting pattern structures 302, the depth-to-width ratio of each of the prepared bit line structures 20 may be further increased, the electrical performance parameters and the signal transmission quality of the prepared bit line are improved, and the situation that the capacitance contact hole cannot be opened can be effectively avoided.

It should be noted that the above embodiments are for illustrative purposes only and do not means to limit the disclosure.

It should be understood that, the steps are not performed in the exact order shown and may be performed in other orders unless otherwise indicated herein. Moreover, at least a portion of the steps of the abovementioned steps may include multiple sub-steps or multiple stages, which are not necessarily performed at the same time, but may be performed at different times, and the order of execution is not necessarily sequential, but may be performed in turns or alternately with other steps or at least a portion of the sub-steps or stages of other steps.

Respective embodiments in the description are described in a progressive manner, each embodiment focuses on the difference from other embodiments, and the same and similar parts among the various embodiments are referenced to each other.

The technical features of the embodiments described above may be arbitrarily combined. In order to make the description simple, not all the possible combinations of the technical features in the above embodiments are completely described. However, all of the combinations of these technical features should be considered as within the scope described in the present specification as long as there is no contradiction in the combinations of these technical features.

The above embodiments merely illustrate several implementations of the disclosure, and the description thereof is specific and detailed, but they are not constructed as limiting the patent scope of the disclosure. It should be noted that a number of variations and improvements made by those of ordinary skill in the art without departing from the conception of the disclosure are within the protection scope of the disclosure. Therefore, the patent protection scope of the disclosure should be subject to the appended claims.

The invention claimed is:

1. A method for preparing a semiconductor structure, comprising:
   providing a substrate;
   successively arranging a first conductive material layer, a barrier material layer, a second conductive material layer and a first dielectric material layer on the substrate stacked onto one another;
   forming a supporting layer on the first dielectric material layer, the supporting layer comprising a plurality of supporting pattern structures spaced apart from each other, the supporting pattern structures extending along a first direction, and a first trench being provided between two adjacent supporting pattern structures;

forming a second dielectric layer, the second dielectric layer filling the first trench, and an upper surface of the second dielectric layer being flush with an upper surface of the supporting layer;

removing a portion of the second dielectric layer, a portion of the first dielectric material layer, a portion of the second conductive material layer, a portion of the barrier material layer and a portion of the first conductive material layer to form a bit line array, wherein the bit line array comprises a plurality of bit line structures spaced apart from each other, the bit line structures extend along a second direction, the second direction is orthogonal to the first direction, and each of the supporting pattern structures penetrates through the bit line array; and forming a bit line protective layer, the bit line protective layer at least covering a side wall of each of the bit line structures.

2. The method for preparing the semiconductor structure of claim 1, wherein forming the supporting layer on the first dielectric material layer comprises:

forming a supporting material layer on the first dielectric material layer, the supporting material layer covering an upper surface of the first dielectric material layer; and etching, by using the first dielectric material layer as an etch stop layer, a portion of the supporting material layer through a dry etching process to form the supporting layer.

3. The method for preparing the semiconductor structure of claim 2, wherein forming the supporting layer comprises:

an etching selectivity ratio of the supporting material layer to the first dielectric material layer is greater than 10:1 under a same condition.

4. The method for preparing the semiconductor structure of claim 3, wherein a material forming the supporting material layer comprises silicon carbon nitride; and a material forming the first dielectric material layer comprises silicon nitride.

5. The method for preparing the semiconductor structure of claim 1, wherein a width of each of the supporting pattern structures is ½ to 1 of a width of each of the bit line structures.

6. The method for preparing the semiconductor structure of claim 1, wherein a width of each of the bit line structures is comprised between 5 nm and 10 nm.

7. The method for preparing the semiconductor structure of claim 1, wherein forming the second dielectric layer, the second dielectric layer filling the first trench, and the upper surface of the second dielectric layer being flush with the upper surface of the supporting layer, comprises:

forming a second dielectric material layer on the supporting layer, the second dielectric material layer covering the upper surface of the supporting layer and filling the first trench; and removing, by using the supporting layer as a stop layer, a portion of the second dielectric material layer through a planarization process, wherein a remaining portion of the second dielectric material layer forms the second dielectric layer.

8. The method for preparing the semiconductor structure of claim 1, wherein forming the bit line array comprises:

forming a first patterned photoresist layer on the upper surface of the second dielectric layer, the first patterned photoresist layer being provided with a first opening, and the first opening being configured to limit a shape and a position of each of the bit line structures; and etching, by using the first patterned photoresist layer as a mask, the portion of the second dielectric layer, the portion of the first dielectric material layer, the portion of the second conductive material layer, the portion of the barrier material layer and the portion of the first conductive material layer to form a second trench, the second trench exposing the side wall of each of the bit line structures.

9. The method for preparing the semiconductor structure of claim 8, wherein forming the bit line protective layer comprises:

forming a bit line protective material layer, the bit line protective material layer at least covering the side wall of each of the bit line structures and a surface of the supporting layer;

forming a sacrificial layer, the sacrificial layer filling the second trench between two adjacent bit line structures, and an upper surface of the sacrificial layer being flush with the upper surface of the supporting layer;

removing the supporting layer, the second dielectric layer, a portion of the sacrificial layer and a portion of the bit line protective material layer, wherein a remaining portion of the bit line protective material layer forms the bit line protective layer; and removing the sacrificial layer.

10. The method for preparing the semiconductor structure of claim 9, wherein forming the sacrificial layer comprises:

forming a sacrificial material layer, the sacrificial material layer covering the upper surface of the second dielectric layer and the upper surface of the supporting layer, and filling the second trench; and removing, by using the supporting layer as a stop layer, a portion of the sacrificial material layer through a planarization process, wherein a remaining portion of the sacrificial material layer forms the sacrificial layer.

11. The method for preparing the semiconductor structure of claim 10, wherein forming the sacrificial material layer comprises:

forming the sacrificial material layer through a spin on dielectric process.

12. The method for preparing the semiconductor structure of claim 1, wherein the bit line protective layer comprises a first bit line protective layer, a second bit line protective layer and a third bit line protective layer successively stacked onto one another, and a material forming the first bit line protective layer is the same as a material forming the third bit line protective layer.

13. The method for preparing the semiconductor structure of claim 12, wherein the material forming the first bit line protective layer is silicon nitride; and a material forming the second bit line protective layer is silicon oxide.

14. The method for preparing the semiconductor structure of claim 1, wherein a material forming the first dielectric material layer is the same as a material forming the second dielectric layer.

15. A semiconductor structure, the semiconductor structure being prepared by the method for preparing the semiconductor structure according to claim 1.

* * * * *